(12) United States Patent
Jeong et al.

(10) Patent No.: US 7,944,146 B2
(45) Date of Patent: May 17, 2011

(54) PHOTOCATHODE LIGHTING DEVICE, METHOD FOR MANUFACTURING THE SAME AND EXPOSURE APPARATUS USING PHOTOCATHODE LIGHTING DEVICE

(75) Inventors: Hyo-Soo Jeong, Seoul (KR); Kristopher Warren Keller, Danville, CA (US); Joseph Bradley Culkin, Danville, CA (US)

(73) Assignee: Photegra Corporation, Emeryville, CA (US)

( * ) Notice: Subject to any disclaimer, the term of this patent is extended or adjusted under 35 U.S.C. 154(b) by 307 days.

(21) Appl. No.: 12/373,405

(22) PCT Filed: Jul. 13, 2007

(86) PCT No.: PCT/KR2007/003420
§ 371 (c)(1),
(2), (4) Date: Jan. 12, 2009

(87) PCT Pub. No.: WO2008/007928
PCT Pub. Date: Jan. 17, 2008

(65) Prior Publication Data
US 2009/0309483 A1    Dec. 17, 2009

(30) Foreign Application Priority Data

Jul. 13, 2006  (KR) .................. 10-2006-0065665
May 28, 2007  (KR) .................. 10-2007-0051746

(51) Int. Cl.
*H01J 31/50* (2006.01)
(52) U.S. Cl. ......................................... 313/530; 438/20
(58) Field of Classification Search .................. 313/414, 313/441–460, 495–497, 293–304, 306, 309–310, 313/346, 351, 355, 523–525, 530, 539, 542, 544; 438/20
See application file for complete search history.

(56) References Cited

U.S. PATENT DOCUMENTS
6,002,207 A    12/1999  Beeteson et al.

FOREIGN PATENT DOCUMENTS
| EP | 0 605 964 | 7/1994 |
| JP | 07-240143 | 9/1995 |
| JP | 2002-334674 | 11/2002 |
| WO | 01/08192 | 2/2001 |
| WO | 02/015223 A1 | 2/2002 |

OTHER PUBLICATIONS

Search Report issued by the European Patent Office on Jul. 23, 2009 for the corresponding European Patent Application No. 07768749.9.
International Search Report for PCT/KR2007/003420 mailed Oct. 10, 2007.
Written Opinion for PCT/KR2007/003420 mailed Oct. 10, 2007.

*Primary Examiner* — Peter J Macchiarolo
*Assistant Examiner* — Donald L Raleigh
(74) *Attorney, Agent, or Firm* — Nixon & Vanderhye PC

(57) ABSTRACT

The photocathode lighting device of planar light emission including: a light source unit emitting a first light; a cathode plate contacted face-to-face with the light source unit; a metal mask layer adhered to the cathode plate and including a repetitive plurality of apertures; a photocathode formed on a surface of the metal mask layer, receiving the first light, and emitting an electron; an anode plate facing the cathode plate and spaced apart from the cathode plate; and a phosphor formed in a lower part of the anode plate and emitting a second light when the emitted electron collides with the phosphor.

18 Claims, 10 Drawing Sheets

| LIGHT SOURCE | ANODE VOLTAGE | $d_2/d_1$ RATIO | | |
|---|---|---|---|---|
| | | 2:1 | 10:1 | 20:1 |
| LIGHT BULB | 5 KV | 284 | 342 | 508 |
| | 10 KV | 360 | 657 | 1,588 |
| | 12 KV | 386 | 1,042 | 3,465 |
| BLUE LED | 5 KV | 302 | 452 | 598 |
| | 10 KV | 486 | 1,021 | 2,245 |
| | 12 KV | 698 | 1,598 | 4,765 |

[UNIT: nA]

(a)

(b)

(c)

US 7,944,146 B2

PHOTOCATHODE LIGHTING DEVICE, METHOD FOR MANUFACTURING THE SAME AND EXPOSURE APPARATUS USING PHOTOCATHODE LIGHTING DEVICE

This application is the U.S. national phase of International Application No. PCT/KR/2007/003420, filed 13 Jul. 2007, which designated the U.S. and claims priority to Korean Application No(s). 10-2006-0065665, filed 13 Jul. 2006 and 10-2007-0051746, filed 28 May 2007, the entire contents of each of which are hereby incorporated by reference.

TECHNICAL FIELD

The present invention relates to a photocathode lighting device of planar light emission, a method of manufacturing the photocathode lighting device, and an exposure apparatus using the photocathode lighting device, and more particularly, to a photocathode lighting device of planar light emission including a photocathode, a mercury (Hg)-free planar light source device using the photocathode lighting device, and an exposure apparatus eliminating a need for an optical system including a lens or a mirror or minimizing the optical system.

BACKGROUND ART

A lamp used as a light source corresponding to a core of a lighting industry is generally formed in a tubular form, and except for special cases, includes much mercury (Hg) in a tube of the lamp. Similarly, a lamp for ultraviolet (UV) light use and a general lamp for visible light use generally include a structure of a tubular form and Hg.

A planar lamp of a planar light source form, in general, may be more conveniently and practically utilized than a tubular lamp. A plurality of optical parts and a complex structure are required for configuring the planar lamp to emit uniform light using a tubular lamp. However, since the tubular lamp is used as is, Hg is included as is even in the case of the planar light source. Also, there is a disadvantage that a total volume is increased and brightness is uneven.

Also, research on eco-friendly Hg-free lamp development excluding Hg is actively underway in the lighting industry according to the Restriction of Hazardous Substances (RoHS) directive. Also, research on the planar lamp, having many advantages in a practical aspect, is actively underway.

A photolithography is a method of forming an electrode pattern and the like on a substrate or an exposed object when manufacturing the substrate or the exposed object, and is also used in various industry fields such as a flat panel display (FPD) industry manufacturing plasma display panels (PDPs), liquid crystal displays (LCDs), and the like, a printed circuit board (PCB) industry, a semiconductor industry, a micro-electro-mechanical system (MEMS) industry, and the like.

Generally, a photolithography process includes a substrate cleaning process, a surface treatment process, a photoresist (PR) coating process, an alignment/exposure process, and a development process. In particular, an apparatus for performing the alignment/exposure process is referred to as an exposure apparatus.

The exposure apparatus is used for realizing a minute circuit pattern on the substrate, and an exposure technology is rapidly improved by improving component technologies related to exposure apparatus components, that is, a light source, an illumination system, a pattern mask, a reticle, a stage, a PR, and the like.

As semiconductor apparatuses increasingly become highly-integrated in the semiconductor industry, a high resolution is required for a circuit pattern image realizing a minute line width on a wafer in the exposure apparatus, and research on several components installed in the exposure apparatus is actively underway in order to accurately realize the minute line width in a circuit.

FIG. 1 illustrates an exposure apparatus generally used according to a conventional art. A conventional exposure apparatus generally includes a lighting system for emitting and irradiating light, an optical system for standardizing and aligning the irradiated light and controlling focus, a pattern mask including a pattern, and a substrate.

The lighting system includes a light source 130 emitting light such as a super high-voltage Hg lamp, a halogen lamp, and the like, and an oval mirror 140 condensing light of the light source 130 and irradiating light to one direction. The optical system includes a cold mirror 150, an integrator lens 170, a collimate mirror 160, and a spherical mirror 180 in order to control a direction and a feature of the light.

The light emitted from the light source 130 is condensed by the oval mirror 140 and is incident on the cold mirror 150. In this instance, a multi-layered coating processing has been performed on surfaces of the oval mirror 140 and the cold mirror 150. Accordingly, a specific UV light wavelength is reflected and other wavelengths are passed. In particular, the cold mirror 150 is a mirror reflecting light in a UV light wavelength range from the light reflected from the oval mirror 140, and allowing light of a visible light wavelength range and an infrared light wavelength range to penetrate through. Also, since the exposure apparatus used for the general exposure process uses light of a UV light range, the cold mirror 150 may be a cold mirror for UV light.

The direction of travel of the light incident on the cold mirror 150 is changed, and the light incident on the cold mirror 150 is incident on the integrator lens 170. The integrator lens 170 includes a multiple lens-array including a combination of small, independent spherical lenses. The integrator lens 170 includes a first lens 170a and a second lens 170b, and the light incident on the independent spherical lens of the first lens 170a is emitted after passing through the unit sphere lens of the second lens 170b in which optical axes are accorded again.

The light passing through the integrator lens 170 remains parallel, is reflected by the collimate mirror 160, and is incident on the spherical mirror 180. The light reflected by the spherical mirror 180 travels parallel with an optical axis, passes through a pattern mask 120, and exposes the pattern formed in the pattern mask 120 to an exposed object 100.

Currently, a number cutting methods applied for improving productivity of a pattern-forming process of the substrate or the exposed object are attempted, and expansion of an exposure area is essential for the application of the number cutting methods. However, when the exposure area is expanded by using the optical system in the conventional exposure apparatus, the effective intensity of a illuminating light is reduced. Accordingly, exposure efficiency is reduced along with pattern quality, exposure time for forming the pattern is increased, and the like.

Also, since the optical system, standardizing and aligning the light emitted from the light source, and controlling the focus, is made of a complex mirror structures and lenses, the conventional exposure apparatus creates high equipment manufacturing costs and an enormous and bulky exposure apparatus in size.

Also, as a device patterned on the exposed object 100 or a feature size becomes increasingly smaller, technical problems are generated. Specifically, in order to realize a small semiconductor device or feature size, electromagnetic radiation having a short wavelength is required to be used in order to project a pattern of a reticle or a pattern mask on the exposed object, and there are limits to the optical system having the resolution and an imaging capability required for an extreme UV light wavelength.

Also, the conventional exposure apparatus has an uneconomical aspect of high maintenance costs due to a high power consumption caused by a high voltage and a high current, and since the light source emitting light, such as a superhigh-voltage Hg lamp, a halogen lamp, and the like, has a long setup time, a low productivity yield may be a result.

DISCLOSURE OF INVENTION

Technical Goals

The present invention provides an exposure apparatus including a photocathode lighting device with planar light emission to have a minimized optical system structure, eliminating a need for various mirrors and lenses.

The present invention also provides an eco-friendly mercury (Hg)-free planar light source device using light emitted by colliding an emitted electron and a phosphor.

The present invention also provides an ultraviolet (UV) curing device which can perform a whole area emission, or a slit emission or a selective area emission by using an Hg-free planar light source having a small power consumption and a high UV intensity.

The present invention also provides a photocathode lighting device as a next generation display having a small power consumption and a great image color sensitivity by colliding an emitted electron and a phosphor, emitting light, and generating an image.

The present invention also provides a photocathode lighting device which can have an ideal performance as a flat panel display (FPD) with a wide viewing angle, a high-speed response, a thin and light form, and high resolution, and can also have a great brightness and lifetime feature.

The present invention also provides a photocathode lighting device of planar light emission which can have an ideal performance as a liquid crystal display (LCD) backlight individually emitting three primary colors, that is, red, green, and blue, by using a red phosphor, a green phosphor, and a blue phosphor, or emitting white light by adding the three primary colors, and having a small power consumption.

The present invention also provides an exposure apparatus having a small power consumption by overcoming a disadvantage that a conventional exposure apparatus has a large power consumption, and simultaneously providing economical efficiency and a high productivity yield due to a short setup time.

The present invention also provides an exposure apparatus including a photocathode lighting device of planar light emission having low equipment manufacturing costs and a minimized equipment scale.

The present invention also provides an exposure apparatus used for manufacturing a semiconductor, an FPD, a printed circuit board (PCB), and a micro-electro-mechanical system (MEMS) which can improve pattern quality due to an illuminance increase in an exposed effective area, have a short exposure time for forming a pattern, and support a large exposure area, thereby improving exposure efficiency.

The present invention also provides a photocathode lighting device of planar light emission having a great uniformity in light emission, compared with conventional lighting devices such as an FPD and a carbon nano-tube (CNT).

Technical Solutions

According to an aspect of the present invention, there is provided a photocathode lighting device of mercury (Hg)-free planar light emission including: a light source unit emitting a first light; a cathode plate contacted face-to-face with the light source unit; a metal mask layer adhered to the cathode plate and including a repetitive plurality of apertures; a photocathode formed on a surface of the metal mask layer, receiving the first light, and emitting an electron; an anode plate facing the cathode plate and spaced apart from the cathode plate; and a phosphor formed in a lower part of the anode plate and emitting a second light when the emitted electron collides with the phosphor.

According to another aspect of the present invention, there is provided an exposure apparatus including: a photocathode lighting device including: a light source unit emitting a first light; a cathode plate contacted face-to-face with the light source unit; a metal mask layer adhered to the cathode plate and including a repetitive plurality of apertures; a photocathode formed on a surface of the metal mask layer, receiving the first light, and emitting an electron; an anode plate facing the cathode plate and spaced apart from the cathode plate; and a phosphor formed in a lower part of the anode plate and emitting a second light when the emitted electron collides with the phosphor; and a stage supporting an exposed object projecting a pattern of a pattern mask by the second light, wherein the second light is incident perpendicular to a surface of the exposed object.

According to still another aspect of the present invention, there is provided a method of manufacturing a photocathode lighting device of Hg-free planar light emission, the method including: forming a light source unit emitting a first light and a cathode plate contacted face-to-face with the light source unit; forming a metal mask layer adhered to the cathode plate and including a repetitive plurality of apertures; forming a photocathode on a surface of the metal mask layer, receiving the first light, and emitting an electron; forming an anode plate facing the cathode plate and spaced apart from the cathode plate; and forming a phosphor in a lower part of the anode plate, the phosphor emitting a second light when the emitted electron collides with the phosphor.

BEST MODE FOR CARRYING OUT THE INVENTION

Figure 1:
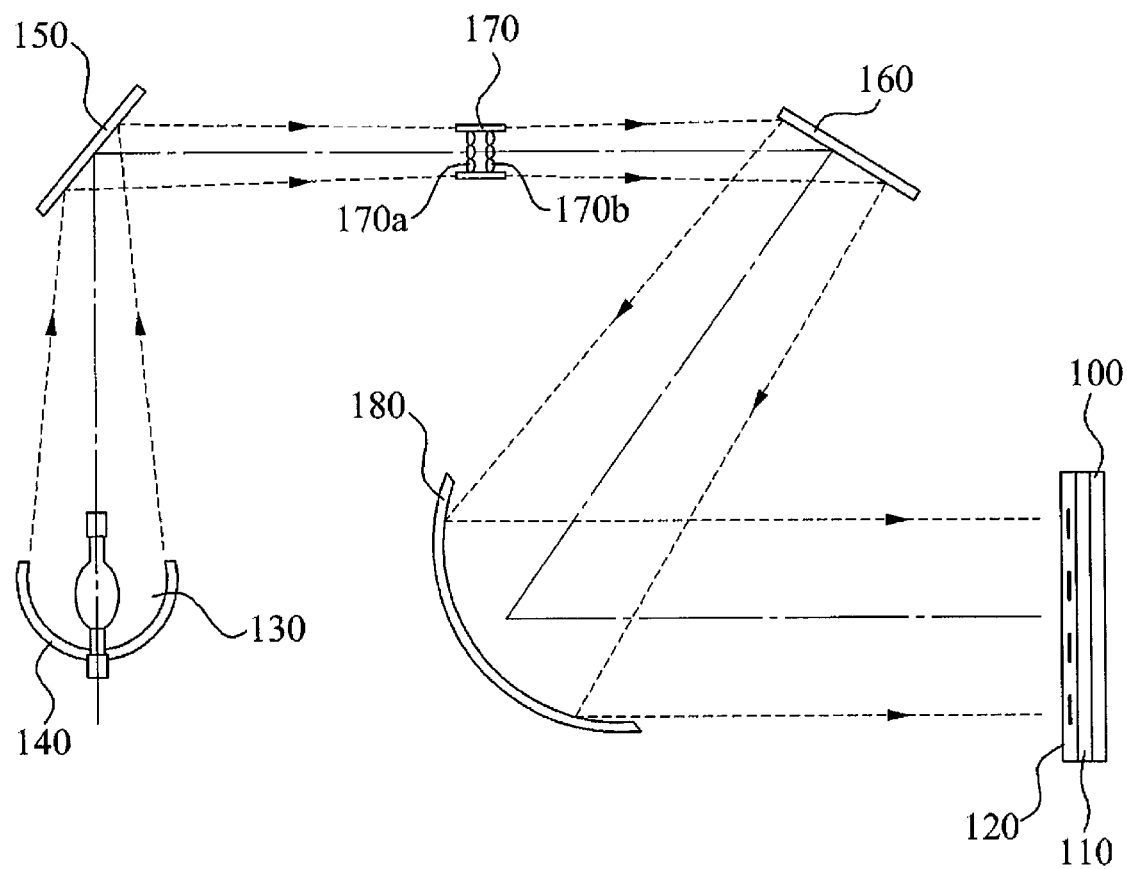
FIG. 1 is a diagram illustrating an exposure apparatus generally used according to a conventional art.

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 2:
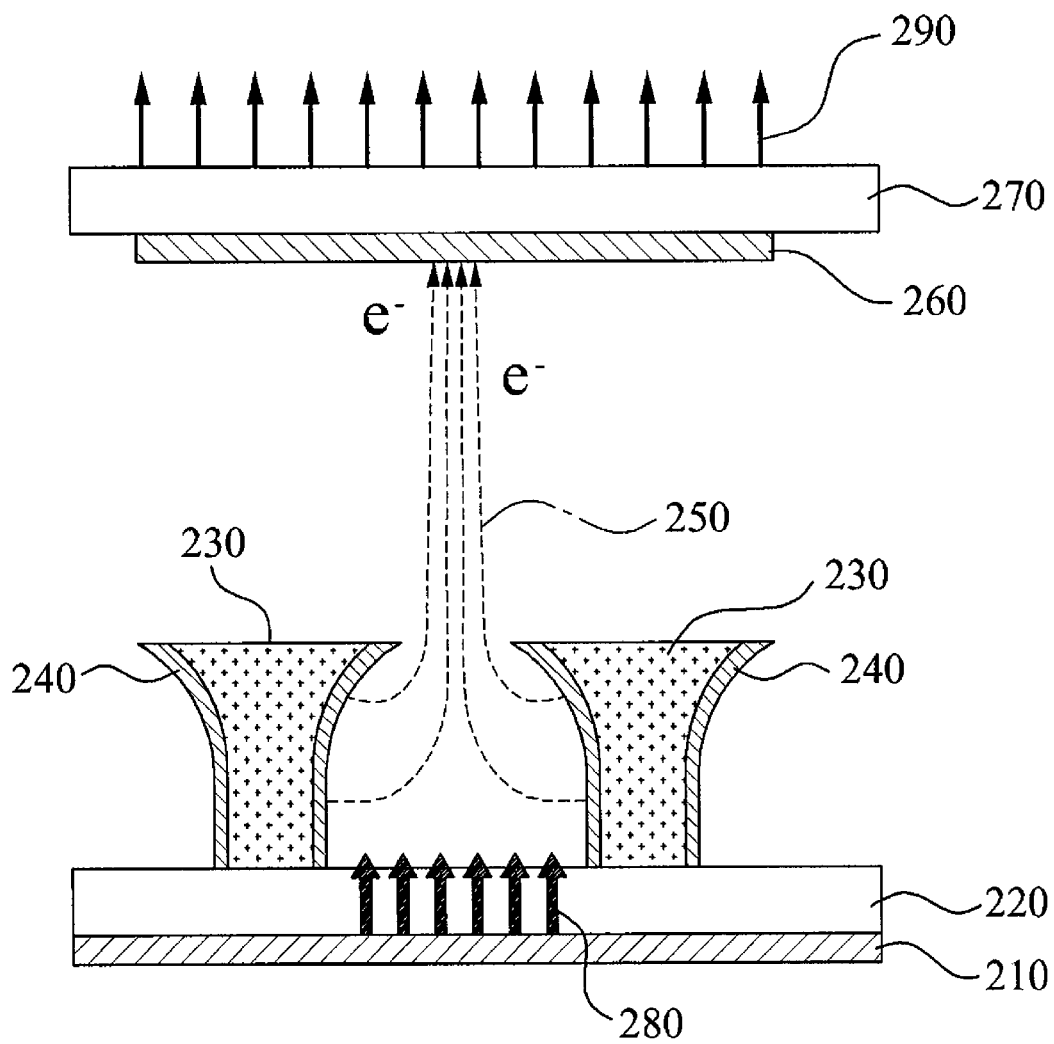
FIG. 2 is a sectional diagram illustrating a section of a photocathode lighting device structure according to an exemplary embodiment of the present invention.

FIG. 2 is a sectional diagram illustrating a section of a photocathode lighting device structure according to an exemplary embodiment of the present invention. Referring to FIG. 2, a photocathode lighting device 200 includes a light source unit 210 emitting a first light, a cathode plate 220 contacted face-to-face with the light source unit 210, a metal mask layer 230 adhered to the cathode plate 220 and including a repetitive plurality of apertures, a photocathode 240 formed on a surface of the metal mask layer 230, receiving the first light and emitting an electron, an anode plate 270 facing the cathode plate 220 and spaced apart from the cathode plate 220, and a phosphor 260 formed in a lower part of the anode plate 270 and emitting a second light when the emitted electron collides with the phosphor 260.

The light source unit 210 may be applied to all types of lamps and devices emitting light besides a light source emitting light such as a superhigh-voltage mercury (Hg) lamp, a halogen lamp, and the like, in a conventional exposure device. The light source unit 210 may have a high efficiency of greater than or equal to 40% in the case of a light emitting diode (LED), and the light source unit of the present invention may be a blue LED. Also, a wavelength of the first light may have a range between about 450 nm and about 500 nm.

The cathode plate 220 may use commercialized glass by which light incident from an outside can be sufficiently transmitted. In particular, silica, magnesium fluoride ($MgF_2$) having a great transmittance in an ultraviolet (UV) light range, and the like, may be used. Especially, when the light source unit emits light in the UV light range, any one of synthetic quartz, sapphire, and $MgF_2$ having a great transmittance in the UV light range may be used. Also, the cathode plate 220 is a transparent insulating substrate, and may use a transparent material having a sufficient structural strength. The cathode plate 220 is transparent to light in order to project a maximum amount of light on an irradiation area as possible. The cathode plate may have a predetermined thickness, however, and may be approximately less than or equal to 10 mm.

The first light 280 emitted from the light source unit 210 is projected on the cathode plate 220, passes through the cathode plate 220, and is absorbed in a predetermined irradiation area by the photocathode 240. When the first light 280 is projected on the irradiation area, the photocathode 240 emits an electron 250 from a surface of the photocathode 240 facing the irradiation area. Also, a material having a high conductivity may be deposed on a surface of the cathode plate 220 in order to prevent an electric charging phenomenon on the facing cathode plate 220. Specifically, a transparent substrate where a coating of a transparent conductive film is performed may be used for the cathode plate 220 in this case. The transparent conductive film used in this case may be indium-tin-oxide (ITO), zinc oxide (ZnO), indium oxide ($In_2O_3$), tin dioxide ($SnO_2$), and the like.

The first light 280 is absorbed in a surface or a vicinity of the photocathode 240 by the photocathode 240 corresponding to the irradiation area. At this point in time, the electron 250 may have a kinetic energy equal to an energy minus a work function from a photon energy. When much energy is not lost by a collision in a material of the photocathode 240, the electron 250 is emitted in the irradiation area from a surface of the photocathode 240.

Also, the photocathode lighting device of the present invention includes the metal mask layer 230 in order to emit the electron 250 in only a specific surface spot. Also, the photocathode lighting device of the present invention may further include a metal mask layer between the cathode plate 220 and the photocathode 240 in order to block the first light 280 so that the first light 280 may be incident on only the irradiation area. The metal mask layer 230 may include a general metal material. A material identical to an aluminum killed steel (AK) mask used for a cathode ray-tube (CRT) may be used. The photocathode 240 may generally have no metal mask layer or at least one metal mask layer.

The photocathode 240 may include a predetermined material emitting the electron when light is irradiated. The photocathode 240 includes a composite material including at least one element selected from the group consisting of an alkali metal, antimony (Sb), tellurium (Te), aluminum (Al), an I-VI group semiconductor, a II-VI group semiconductor, and a III-V group semiconductor. The material used for the photocathode 240 currently commercialized may be divided into a group including the alkali metal as a main component having a low work function, and a group of the I-VI group semiconductor, the III-V group semiconductor such as gallium arsenide (GaAs), and the II-VI group semiconductor such as zinc selenide (ZnSe). The photocathode material including the alkali metal as the main component includes cesium (Cs)-iodine (I), Cs—Te, Sb—Cs, the material using alkali metals of two types, Sb-rubidium (Rb)—Cs, Sb-kalium (K)—Cs, Sb-natrium (Na)—K, Sb—Na—K—Cs using three types of alkali metals, and the like. There are GaAs(Cs), InGaAs(Cs), and the like as the photocathode material including GaAs as the main component. Also, the photocathode 240 of the present invention may be a compound of the alkali metal, Te, and Sb. A thickness of the photocathode of the present invention may be less than about 1 mm. Also, a photocathode having a reflective mode which enables the electron to be emitted in a direction of receiving light may be used for the photocathode 240 of the present invention.

A photon of the first light 280 has the energy of the work function of the photocathode 240 at a minimum. The photocathode 240 emits the electron 250 when the photon energy is irradiated by the photon in the case of where the photon energy is greater than the work function of the photocathode. The electron 250 is accelerated between the photocathode 240 and the anode plate 270 by a voltage applied between the photocathode 240 and the anode plate 270. The voltage between the photocathode 240 and the anode plate 270 generated by a power supply (not illustrated) installed in an outside of a vacuum chamber is generally several kV through tens of kV.

When the accelerated electron 250 collides with the phosphor 260 formed in the lower part of the anode plate 270, the second light 290 is emitted. A wavelength of the second light emitted to an outside is determined according to a type of the used phosphor. When a UV phosphor is used, UV light is generated, and when a phosphor of a visible light range is used, visible light is generated. Also, when the UV phosphor and the phosphor of the visible light range are used, a mixed light is generated. Since the phosphor 260 may be distributed with large area in the lower part of the anode plate 270, the second light 290 emitted from the phosphor 260 may also have a light emission of large area. Accordingly, an exposure device application may have a large exposure area.

Also, the photocathode lighting device 200 of the present invention may have a mirror layer in an upper end of the metal mask layer of the cathode plate in order to reflect back, to the phosphor, light emitted from the phosphor to the cathode plate when there is no aluminum layer on a surface of the phosphor 260. The mirror layer is made of a material selected from the group consisting of titanium dioxide ($TiO_2$) and Al.

Also, a photocathode having the reflective mode type which enables the electron to be emitted in the direction of receiving light may be used for the photocathode 240 of the present invention.

The anode plate 270 may use commercialized glass by which light incident from an outside can be sufficiently transmitted, similar to the cathode plate 220. In particular, silica, quartz, $MgF_2$ having a great transmittance in a UV light range, and the like may be used. Especially, when the light source unit emits light in the UV light range, any one of synthetic quartz, sapphire, and $MgF_2$ having a great transmittance in the UV light range may be used. Also, the anode plate 270 is a transparent substrate, and may use a transparent material having a sufficient structural strength. The anode plate 270 is transparent to light in order to project a maximum amount of light on an irradiation area as possible. The anode plate may have a predetermined thickness, however, the anode plate may be approximately less than or equal to 10 mm.

The second light performs a function as an actual light source for exposure of the exposure apparatus of the present invention. The phosphor 260 emits light of various wavelength ranges depending on a type of the phosphor. Specifically, any one wavelength of i-line (365 nm), h-line (405 nm), and g-line (436 nm), or light having another appropriate UV light range is emitted according to a selection of the phosphor 260, and is used for an exposure process. Accordingly, a minute pattern of the pattern mask is projected on the exposed object.

Figure 10:
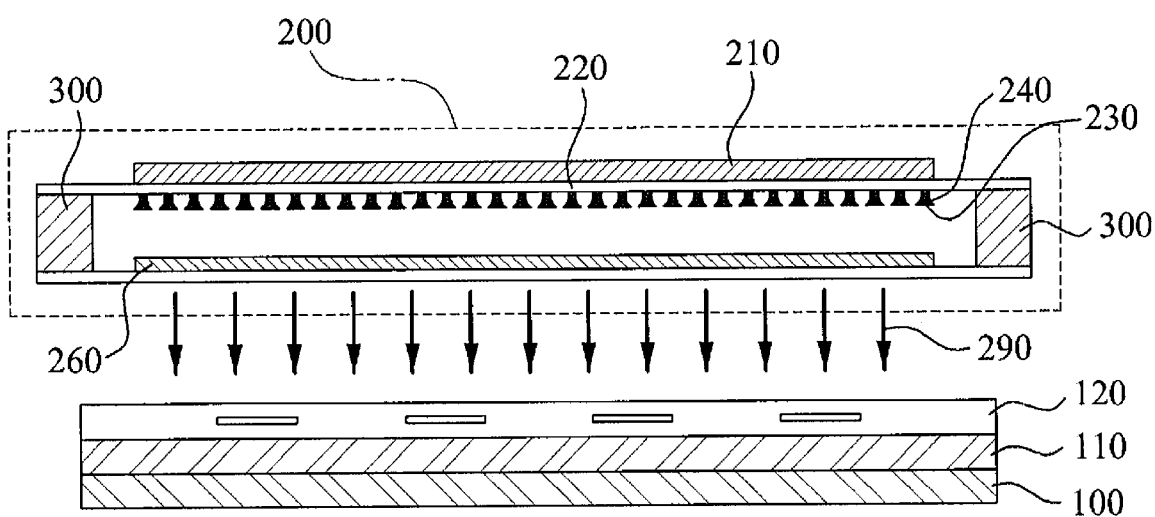
FIG. 10 is a sectional diagram illustrating a section of an exposure apparatus according to an exemplary embodiment of the present invention.

Also, the photocathode lighting device 200 of planar light emission of the present invention may further include a spacer 300 so that the cathode plate 220 may be spaced apart from the anode plate 270, as illustrated in FIG. 10.

As an increase in demand for a flat panel display (FPD) accelerates in an information-oriented society where developing multimedia and mobile service extension are rapidly progressed, the above-described photocathode lighting device 200 may show an ideal performance as an FPD having a wide viewing angle, a high-speed response, a thin and light form, and a high resolution, and a great brightness and lifetime feature, compared with an existing FPD. Specifically, the above-described photocathode lighting device 200 integrates advantages of a conventional field emission display (FED), a cathode-ray tube (CRT), and the FPD. Since an electron gun having a minute size such as in the CRT may emit light by emitting many electrons and colliding many electrons with each phosphor, and generate an image, the photocathode lighting device 200 may be a next generation display which has a small power consumption, a great color gamut of the image, and may be enlarged more easily than the existing FPD due to thinness and lightness. Also, the photocathode lighting device 200 may perform as a photocathode lighting device (display) that may have a great uniformity in light emission.

Figure 3:
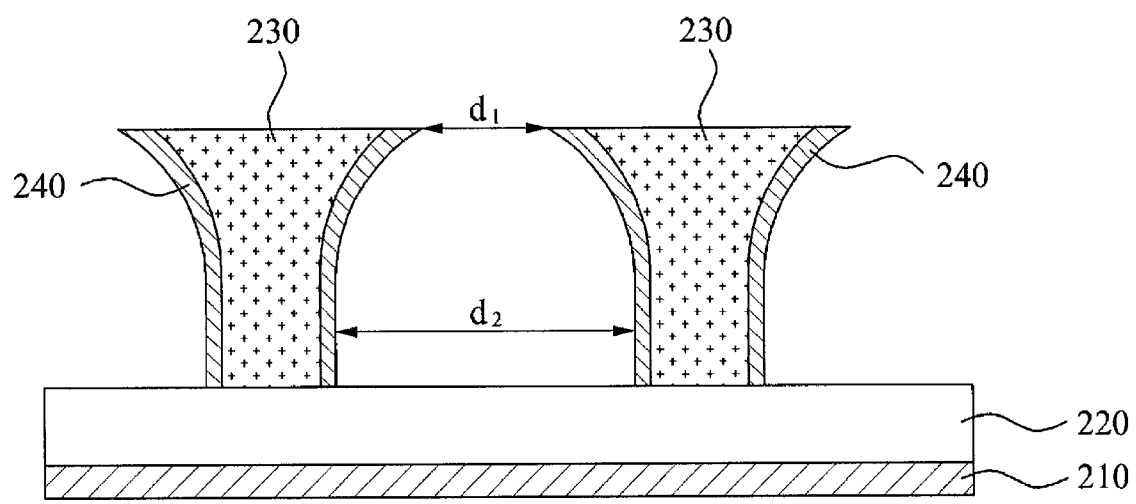
FIG. 3 is a diagram illustrating a cathode plate unit of a photocathode lighting device according to an exemplary embodiment of the present invention.

FIG. 3 is a diagram illustrating a cathode plate unit of a photocathode lighting device according to an exemplary embodiment of the present invention.

Referring to FIG. 3, the cathode plate unit includes a light source unit 210, a cathode plate 220, a metal mask layer 230, and a photocathode 240. Since the components are described in detail in FIG. 2, a detailed description thereof is omitted.

The first light emitted from the light source unit 210 is projected on the cathode plate 220, passes through the cathode plate 220, and is absorbed in a predetermined irradiation area by the photocathode 240. When the first light 280 is projected on the irradiation area, the first light 280 is absorbed in a surface or a vicinity of the photocathode 240 by the photocathode 240 corresponding to the irradiation area. When much energy is not lost by a collision in a material of the photocathode 240, an electron is emitted in the irradiation area from a surface of the photocathode 240. Also, the cathode plate unit includes the metal mask layer 230 in order to emit the electron in only a specific surface spot. A number of electrons emitted from the photocathode 240 is determined by a upper diameter of an aperture of a plurality of apertures repetitively formed in the metal mask layer 230, $d_1$, and a bottom diameter formed in a lower part of the aperture of the plurality of apertures, $d_2$. This is described in detail with reference to FIG. 4.

Figures 4, 5:
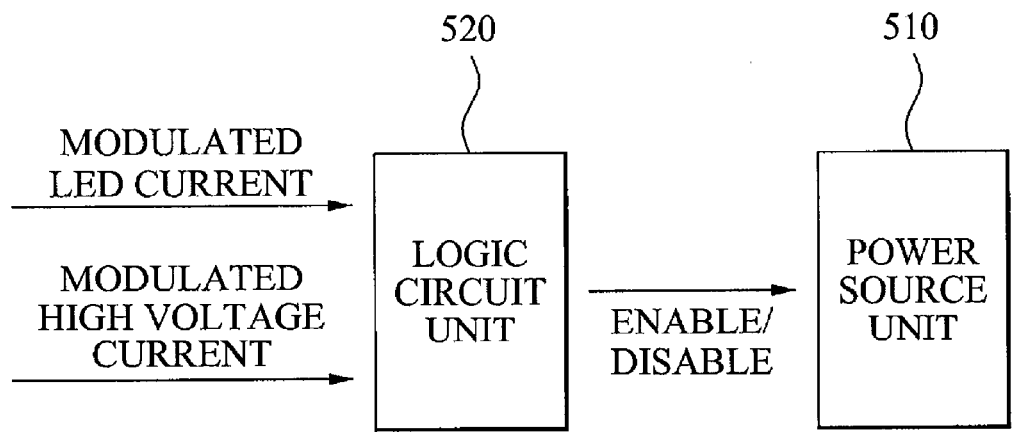
FIG. 4 is a table of simulation results of an electron emission current in a photocathode, arranged according to a ratio of a bottom diameter formed in a lower part of an aperture among a plurality of apertures in a metal mask to a upper diameter of the aperture among the plurality of apertures, the plurality of apertures repetitively formed in a metal mask layer according to an exemplary embodiment of the present invention.
FIG. 5 is a block diagram illustrating a power source unit applying and controlling a voltage applied to a photocathode lighting device, and a logic circuit unit according to an exemplary embodiment of the present invention.

FIG. 4 is a table of simulation results of an electron emission current in a photocathode according to a ratio of a bottom diameter formed in a lower part of an aperture among a plurality of apertures to a upper diameter of the aperture among the plurality of apertures, the plurality of apertures repetitively formed in a metal mask layer according to an exemplary embodiment of the present invention. Referring to FIG. 4, the light source unit used in the present simulation used a light bulb and a blue LED, and a voltage in a range between 5 kV and 12 kV was applied to two substrates. Also, electron emission currents according to electron amounts emitted from an area where the first light was irradiated were measured when the ratios of the bottom diameter formed in the lower part of the aperture, $d_2$, to the upper diameter of the aperture, $d_1$, were 2:1, 10:1, and 20:1. It may be verified by the simulation result of FIG. 4 that as the voltage applied to the anode plate for a predetermined light source unit was increased, an amount of an electron emission current was increased. Also, it may be verified by the simulation result of FIG. 4 that as the ratio of the bottom diameter formed in the lower part of the aperture, $d_2$, to the upper diameter of the aperture, $d_1$, was increased, the amount of the electron emission current was increased. Also, when the light source unit is the blue LED, the electron emission current was measured to be more than the electron emission current than when the light source unit is the general light bulb. The ratio of the bottom diameter of the present invention, $d_2$, to the upper diameter of the aperture, $d_1$, is greater than or equal to 2:1, and may be desirably greater than or equal to 5:1, and be more desirably greater than or equal to 20:1. Also, the ratio of the bottom diameter of the aperture of the photocathode lighting device, $d_2$, to the upper diameter of the aperture, $d_1$, may be in a range between 2:1 and 5:1.

FIG. 5 is a block diagram illustrating a power source unit applying and controlling a voltage applied to a photocathode lighting device, and a logic circuit unit according to an exemplary embodiment of the present invention.

Referring to FIG. 5, the photocathode lighting device 200 of the present invention may further include a power source unit 510 applying a predetermined voltage to both ends of the cathode plate 220 and the anode plate 270, and a logic circuit unit 520 controlling the power source unit 510 by considering the outputted voltage and a light source current of the light source unit 210. The logic circuit unit 520 receives the modulated light source current of the light source unit 210 and the modulated high-voltage current of the high-voltage power source unit 510 according to the modulated light source current, and outputs a control signal for controlling the power source unit 510. When the photocathode lighting device 200 does not sufficiently perform its own function or other accidents are generated, the power source unit 510 applying the high voltage may be controlled so that a user may not be injured. Specifically, when the high voltage is not modulated according to the modulated current of the power source unit 510, the high voltage is not applied to the device.

Also, an intensity of the first light source emitted from the light source unit 210 may be controlled by the control signal of the logic circuit unit 520. When the intensity of the first light source is controlled, the intensity of the second light may be controlled according to the intensity of the first light source. When a predetermined control range, that is, a dimming range, of the first light is in a range of between 0% and 100% on a predetermined voltage condition, the intensity of the second light may be controlled to be in the range of 0% and 100% corresponding to the intensity of the first light source on the predetermined voltage condition. Also, the emitted second light of various wavelength ranges may be independently controlled by controlling a flow of an electron respectively colliding with a red phosphor, a green phosphor, and a blue phosphor by using the control signal. When the applied voltage of the power source unit 510 is greater than or equal to 12 kV, and the anode plate absorbing X-ray is used, the photocathode lighting device 200 of the present invention may have a high efficiency and a long lifetime. Also, the power source unit 510 and the logic circuit unit 520 may be installed in an outside of the photocathode lighting device 200 or be adhered to the outside of the photocathode lighting device 200.

Figure 6:
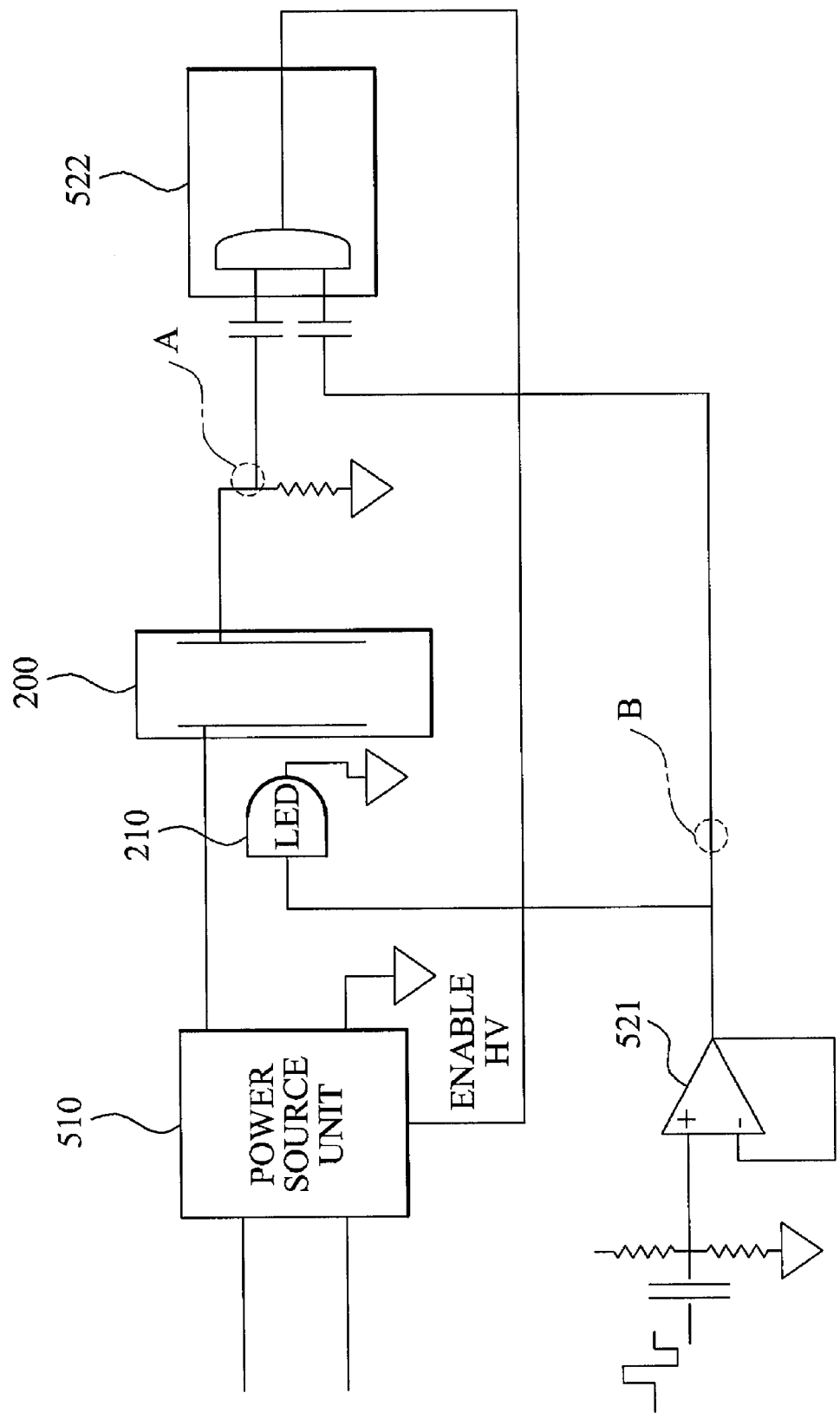
FIG. 6 illustrates an example of applying a power source unit and a logic circuit unit to a photocathode lighting device according to an exemplary embodiment of the present invention.

FIG. 6 illustrates an example of applying a power source unit and a logic circuit unit to a photocathode lighting device according to an exemplary embodiment of the present invention.

Referring to FIG. 6, the voltage outputted from the power source unit 510 and modulated, and the modulated light source current of the light source unit 210 may be inputted in the logic circuit unit including an operational amplifier (op-amp) 521 and an AND gate 522, and control the applied voltage of the power source unit 510 by a predetermined control signal from the logic circuit unit. Specifically, when the modulated current signal of the light source unit, that is, a square wave, and the current signal of the applied high voltage, that is, a square wave, are simultaneously sensed by A and B, the high voltage is applied (enabled) to the device from the power source unit 510. When the signal corresponding to the square wave is not sensed by A, the power source unit 510 is not operated, and the high voltage is not applied to the device. When the photocathode lighting device 200 does not sufficiently perform its own function by the above-described operation or other accidents are generated, the power source unit 510 may be controlled so that a user may not be injured.

Also, aging of the photocathode may be automatically compensated for by automatically controlling the light intensity of the light source unit by using the logic circuit unit and uniformly maintaining the current flowing in the cathode plate 220.

Figure 7:
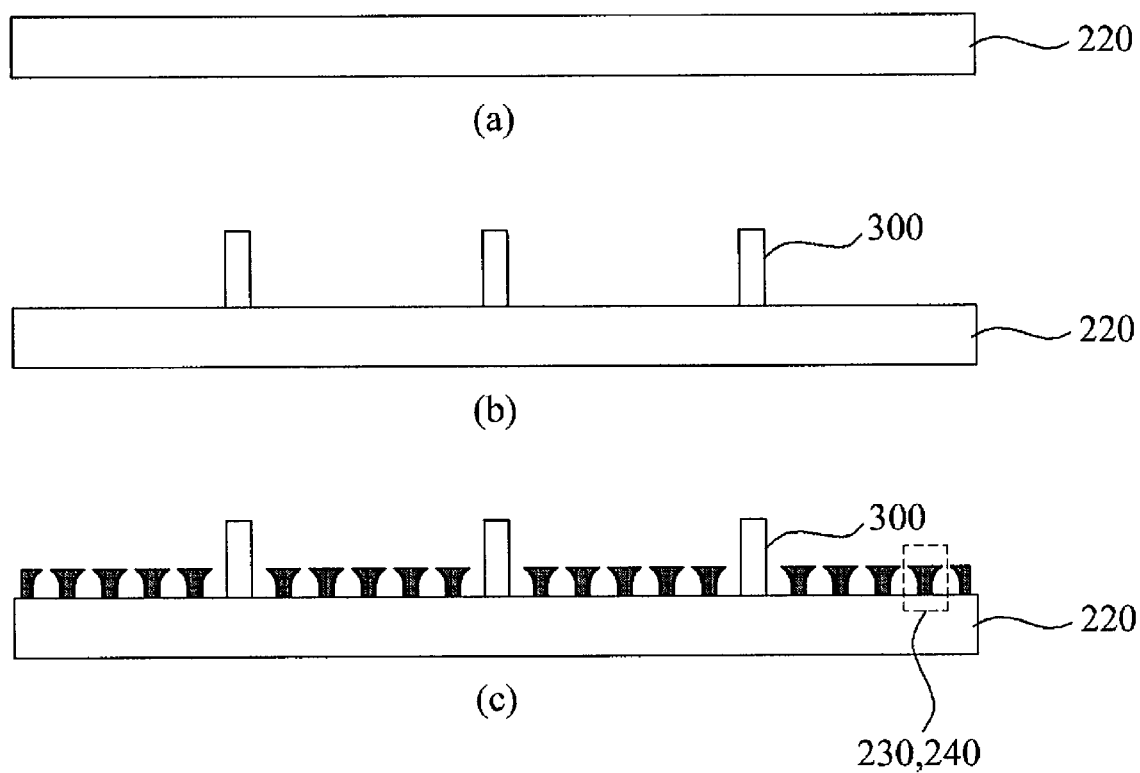
FIGS. 7 and 8 illustrate a flow of a process of manufacturing a cathode plate unit and an anode plate unit of a photocathode lighting device according to an exemplary embodiment of the present invention.
Figure 8:
Figure 8:
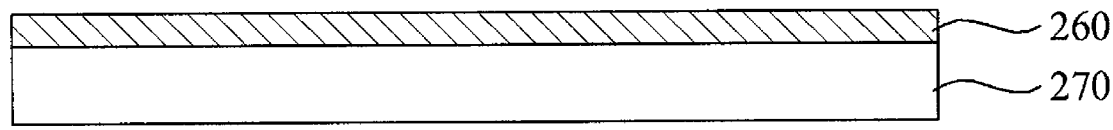
Figure 8:
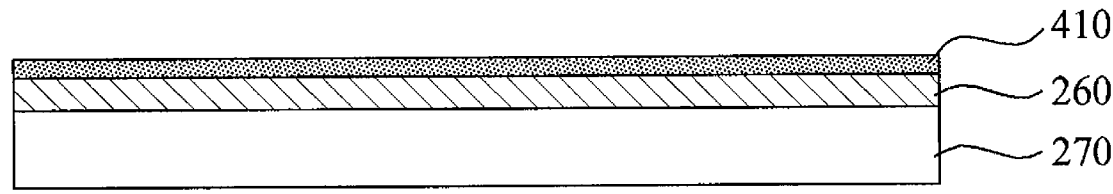

FIGS. 7 and 8 illustrate a flow of a process of manufacturing a cathode plate unit and an anode plate unit of a photocathode lighting device according to an exemplary embodiment of the present invention.

Referring to FIG. 7, a cathode plate 220 is first prepared in order to form the cathode plate unit of the photocathode lighting device according to the present invention in FIG. 7(a). As described above, the cathode plate 220 may use commercialized glass by which light incident from an outside can be sufficiently transmitted. Especially, silica, $MgF_2$ having a great transmittance in an UV light range, and the like, may be used. Next, a spacer 300 for spacing apart from the anode plate 270 at a predetermined distance is formed in FIG. 7(b). The spacer may be unnecessary depending on cases. For example, when a device area is small, the spacer may be unnecessary. Next, a metal mask layer 230 where a photocathode 240 is deposited is combined with the cathode plate 220 in FIG. 7(c). The metal mask is manufactured by a method identical or similar to a method of manufacturing a shadow mask used in a CRT industry. The metal mask layer 230 is etched by a predetermined pattern mask of a metal material, and a pattern of the pattern mask is projected. Considering a feature of an etching process, an isotrophic etching form is shown as illustrated in FIG. 7(c). The photocathode 240 is formed on a surface of the etched metal mask layer 230 by using a physical vapor deposition (PVD) or a chemical vapor deposition (CVD). Here, an additional process of eliminating remaining photocathode existing on the metal mask layer 230 and the cathode plate 220 may be included. A method of forming the photocathode 240 is not limited to the PVD and the CVD, and several methods of forming the photocathode 240 may be applied. After a lower part of the photocathode lighting device 200 is formed, an upper part of the photocathode lighting device 200 is manufactured. The inverse sequence may be performed.

Referring to FIG. 8, an anode plate 270 is first prepared in order to form the anode plate unit of the photocathode lighting device 200 in FIG. 8(a). Next, a phosphor 260 is coated on the anode plate 270 in FIG. 8(b). The phosphor 260 may be the phosphor emitting the second light having a predetermined wavelength range. An emulsion processing is performed on the coated phosphor 260, and aluminum 410 is deposited in FIG. 8(c). Also, when it is intended to use a photocathode device unit according to the present invention for a display, a predetermined pattern is projected on the phosphor 260 by using an etching method of a photolithography or a pattern mask on the phosphor 260, and a predetermined pixel area is generated, resulting in thick film phosphor formation. A method of forming the phosphor is not limited thereto, and several methods of forming the phosphor may be applied.

The photocathode lighting device 200 is manufactured by combining the cathode plate unit with the anode plate unit of the photocathode lighting device 200 manufactured in FIGS. 7 and 8, and combining the light source unit with the cathode plate unit and the anode plate unit.

Also, FIGS. 7 and 8 illustrate an exemplary embodiment of the present invention for manufacturing a photocathode lighting device of planar light emission, and the present invention is not limited thereto.

Figure 9:
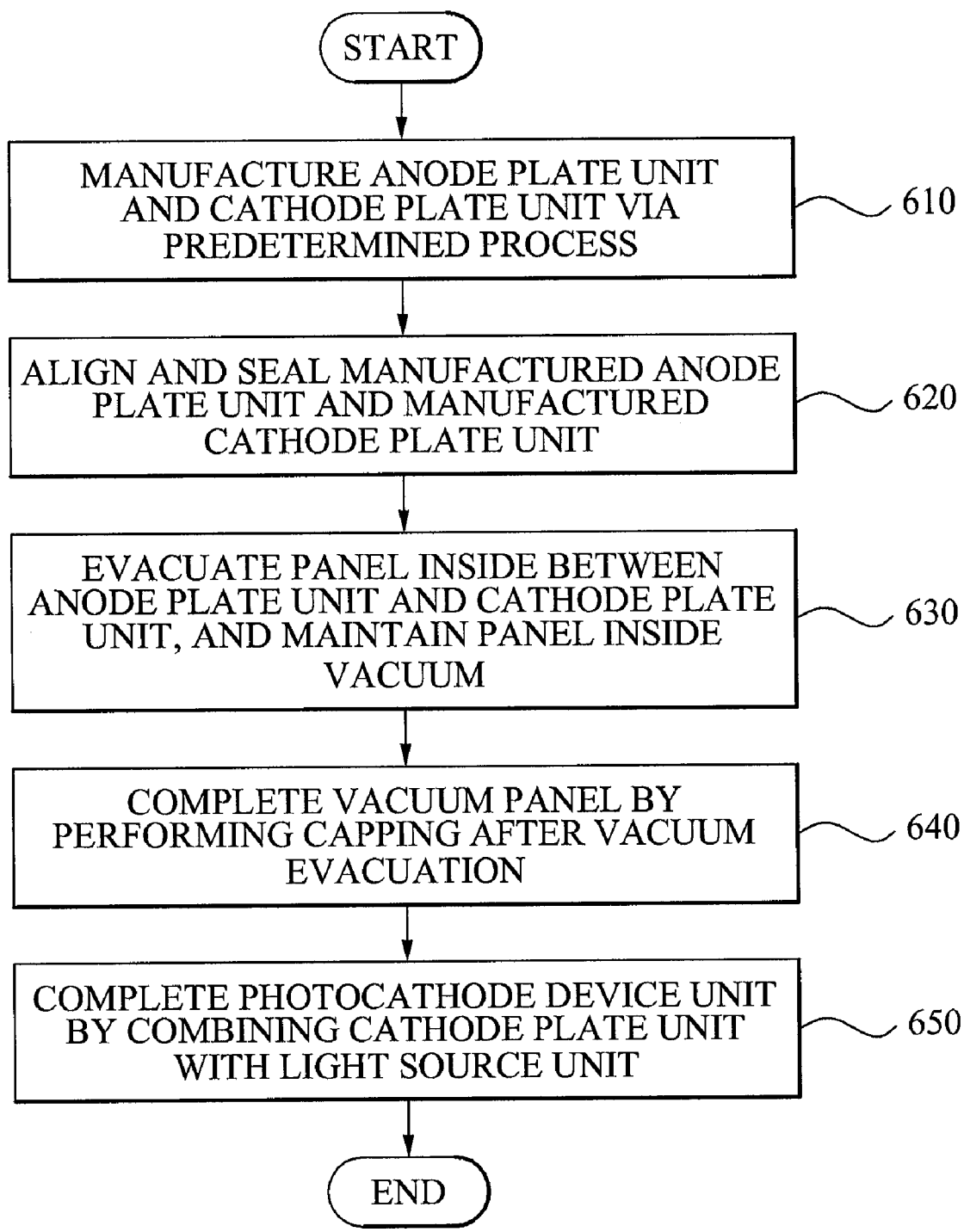
FIG. 9 is a flowchart illustrating a method of manufacturing a photocathode lighting device 200 of FIGS. 7 and 8.

FIG. 9 is a flowchart illustrating a method of manufacturing a photocathode lighting device 200 of FIGS. 7 and 8.

Referring to FIG. 9, the anode plate unit and the cathode plate unit are manufactured via a predetermined process in operation 610 as illustrated in FIGS. 7 and 8. After aligning and sealing the manufactured anode plate unit and the manufactured cathode plate unit in operation 620, a panel inside between the anode plate unit and the cathode plate unit is evacuated, and the panel inside is maintained in a vacuum in operation 630. In operation 640, the vacuum panel is completed by performing a capping after vacuum evacuation. In operation 650, the photocathode device unit is completed by combining the cathode plate unit with the light source unit. The light source unit 210 is not limited to a light source emitting light such as a superhigh-voltage Hg lamp, a halogen lamp of a conventional exposure apparatus, and the like, and a lamp, an apparatus, or a device emitting light are sufficient for the light source unit 210.

Also, the photocathode lighting device 200 of planar light emission according to another exemplary embodiment of the present invention may be manufactured via a process described below. First, a light source unit emitting a first light and a cathode plate contacted face-to-face with the light source unit are formed. Next, a metal mask layer adhered to the cathode plate and including a repetitive plurality of apertures is formed, and a photocathode on a surface of the metal mask layer, receiving the first light, and emitting an electron is formed. Next, an anode plate facing the cathode plate and spaced apart from the cathode plate is formed, and a phosphor in a lower part of the anode plate, the phosphor emitting a second light when the emitted electron collides with the phosphor is formed. Accordingly, the photocathode lighting device of planar light emission may be manufactured.

The above-described photocathode lighting device of planar light emission may be used as an eco-friendly Hg-free planar light source for a lighting industry and other various industry fields.

FIG. 10 is a sectional diagram illustrating a section of an exposure apparatus according to an exemplary embodiment of the present invention. Referring to FIG. 10, an exposure apparatus of the present invention includes the photocathode lighting device 200 described in detail in FIG. 2, projects a pattern of a pattern mask 120 on an exposed object 100 by a second light 290, and an optical axis of the second light is parallel to light perpendicular to a surface of the exposed object 100. Specifically, the second light is vertically incident on the surface of the exposed object. Even though FIG. 10 illustrates that the photocathode lighting device 200 is slightly spaced apart from the pattern mask 120 in order to express emission of the second light, it is actually formed to be adjacent.

As described in detail in FIG. 2, since the second light 290 performs a function as an actual light source for exposure of the present invention, and i-line (365 nm), h-line (405 nm), g-line (436 nm), and the second light 290 having various wavelength ranges may be emitted according to a selection of the phosphor, various minute patterns on the pattern mask may be projected on the exposed object.

The above-described exposure apparatus is not limited to a semiconductor device manufacturing use, and may be widely used for an FPD industry such as a plasma display panel (PDP), a liquid crystal display (LCD), and the like, a printed circuit board (PCB) industry, a micro-electro-mechanical system (MEMS) industry, a UV curing device industry, and a UV cleaning device industry.

Also, since various mirrors and lenses are unnecessary when an exposure process is performed by the exposure apparatus of the present invention, the exposure apparatus having low equipment manufacturing costs and a minimized equipment scale may be provided.

Also, the exposure apparatus of the present invention may further include a stage supporting an exposed object 110. Since the stage is located contacting with the photocathode lighting device, an illuminance in an exposed effective area is increased and a pattern quality is improved. Also, exposure time for forming a pattern is short, and exposure efficiency may be improved.

Figure 11:
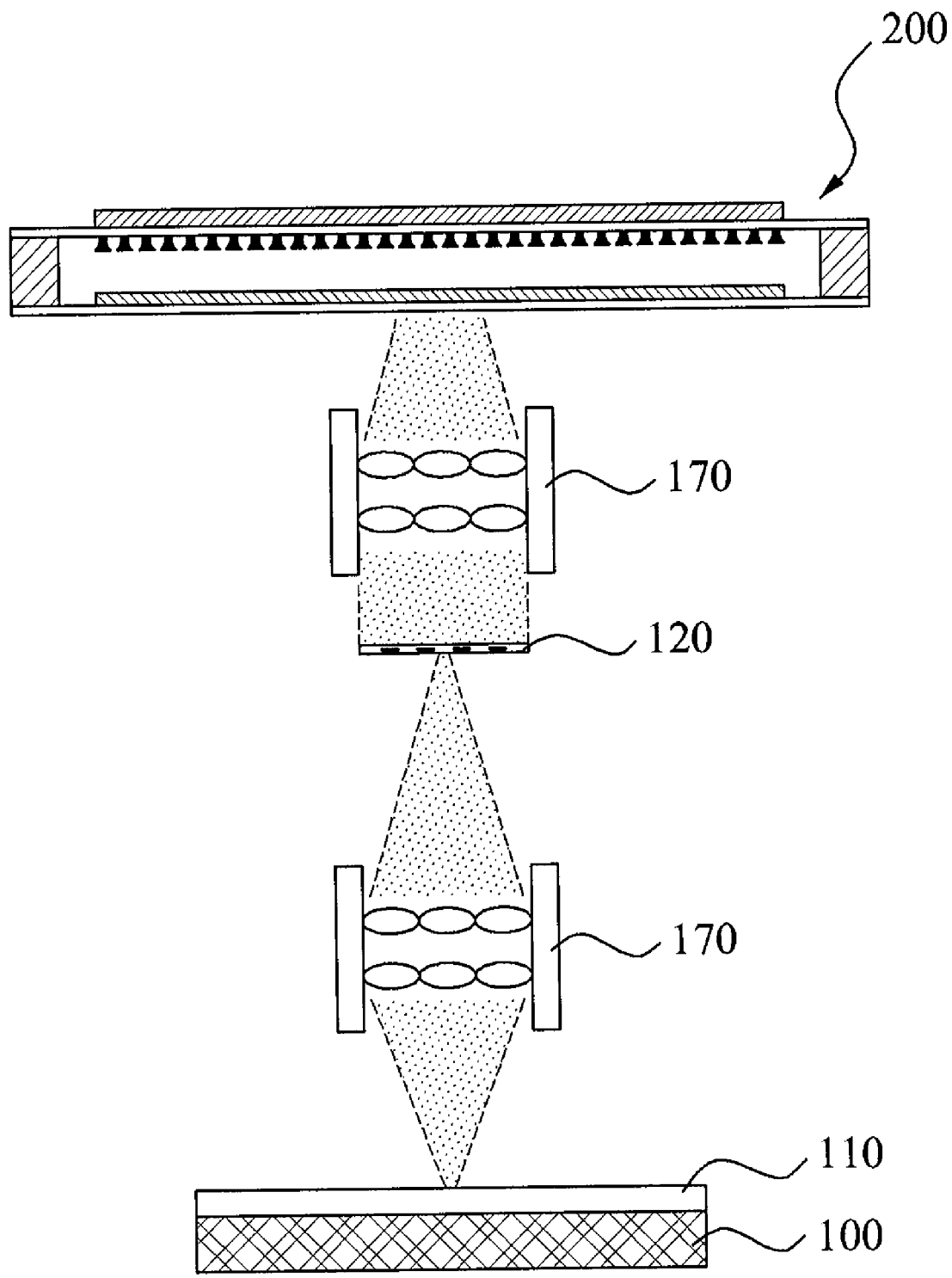
FIG. 11 is a sectional diagram illustrating a section of an exposure apparatus according to another exemplary embodiment of the present invention.

FIG. 11 is a sectional diagram illustrating a section of an exposure apparatus according to another exemplary embodiment of the present invention. Referring to FIG. 11, the exposure apparatus according to the present invention includes the photocathode lighting device 200 described in detail in FIG. 2, or an integrator lens 170. The integrator lens 170 is located between the photocathode lighting device 200 and an exposed object 100 on which a photoresist 110 is coated, and enables the second light emitted from the photocathode lighting device 200 to progress parallel in an optical axis. Specifically, the exposure apparatus of the present invention may expose the exposed object by using a projection method. The integrator lens 170 includes a multiple lens-array including a combination of small, independent spherical lenses as described above. The integrator lens 170 includes a first lens and a second lens, and the second light incident on the unit sphere lens of the first lens is emitted after passing through the spherical unit sphere lens of the second lens in which optical axes are standardized again. Since light remains parallel in the second light passing through the integrator lens 170, an exposure apparatus having a minimized optical system eliminating a need for another mirror or lens may be realized.

There may be at least one integrator lens 170 according to the parallel second light or a relative distance between the exposed object and the photocathode lighting device. Also, when having at least one integrator lens 170, a pattern mask 120 may be located between the integrator lenses 170 or in an area adjacent to the exposed object 100. FIG. 11 illustrates that the pattern mask 120 is located between the integrator lenses 170.

Also, the exposure apparatus of the present invention may further include a stage supporting the exposed object, and the integrator lens 170 condenses the second light on the stage supporting the exposed object.

According to the above-described exemplary embodiments of the present invention, there is provided an exposure apparatus including a photocathode lighting device with planar light emission to have a minimized optical system structure, eliminating a need for various mirrors and lenses.

Also, according to the above-described exemplary embodiments of the present invention, there is provided an eco-friendly Hg-free planar light source device using light emitted by colliding an emitted electron and a phosphor.

Also, according to the above-described exemplary embodiments of the present invention, there is provided a UV curing device which can perform a whole area emission, or a slit emission or a selective area emission by using an Hg-free planar light source having a small power consumption and a high UV intensity.

Also, according to the above-described exemplary embodiments of the present invention, there is provided a photocathode lighting device as a next generation display having a small power consumption and a great image color gamut by colliding an emitted electron and a phosphor, emitting light, and generating an image.

Also, according to the above-described exemplary embodiments of the present invention, there is provided a photocathode lighting device which can have an ideal performance as an FPD with a wide viewing angle, a high-speed response, a thin and light form, and high resolution, and can also have a great brightness and lifetime feature.

Also, according to the above-described exemplary embodiments of the present invention, there is provided a photocathode lighting device of planar light emission which can have an ideal performance as an LCD backlight individually emitting three primary colors, that is, red, green, and blue, by using a red phosphor, a green phosphor, and a blue phosphor, or emitting white light by mixing the three primary colors, and having a small power consumption.

Also, according to the above-described exemplary embodiments of the present invention, there is provided an exposure apparatus having a small power consumption by overcoming a disadvantage that a conventional exposure apparatus has a large power consumption, and simultaneously providing economical efficiency and a high productivity yield due to a short setup time.

Also, according to the above-described exemplary embodiments of the present invention, there is provided an exposure apparatus including a photocathode lighting device of planar light emission having low equipment manufacturing costs and a minimized equipment scale.

Also, according to the above-described exemplary embodiments of the present invention, there is provided an exposure apparatus which can improve pattern quality due to an illuminance increase in an exposed effective area, have a short exposure time for forming a pattern, and support a large exposure area, thereby improving exposure efficiency.

Also, according to the above-described exemplary embodiments of the present invention, there is provided a photocathode lighting device of planar light emission having a great uniformity in light emission, compared with conventional lighting devices such as an FPD and a CNT.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. An exposure apparatus comprising:
a photocathode lighting device comprising:
a light source unit emitting a first light;
a cathode plate contacted face-to-face with the light source unit;
a metal mask layer adhered to the cathode plate and including a repetitive plurality of apertures;
a photocathode formed on a surface of the metal mask layer, receiving the first light, and emitting an electron;
an anode plate facing the cathode plate and spaced apart from the cathode plate; and
a phosphor formed in a lower part of the anode plate and emitting a second light when the emitted electron collides with the phosphor; and
a stage supporting an exposed object projecting a pattern of a pattern mask by the second light,
wherein the second light is incident perpendicular to a surface of the exposed object.

2. The exposure apparatus of claim 1, further comprising:
an integrator lens condensing the second light on the stage, wherein the integrator lens is located between the photocathode lighting device and the exposed object.

3. The exposure apparatus of claim 1, wherein the second light has any one wavelength of i-line (365 nm), h-line (405 nm), and g-line (436 nm).

4. The exposure apparatus of claim 1, wherein the anode plate and the cathode plate are made of a material selected from the group consisting of glass, silica, quartz, sapphire, and magnesium fluoride ($MgF_2$).

5. The exposure apparatus of claim 2, wherein the photocathode comprises a composite material including at least one element selected from the group consisting of an alkali metal, antimony (Sb), tellurium (Te), aluminum (Al), an I-VI group semiconductor, a II-VI group semiconductor, and a III-V group semiconductor.

6. The exposure apparatus of claim 1, wherein the photocathode has a reflective mode.

7. A photocathode lighting device comprising:
a light source unit emitting a first light;
a cathode plate contacted face-to-face with the light source unit;
a metal mask layer adhered to the cathode plate and including a repetitive plurality of apertures;
a photocathode formed on a surface of the metal mask layer, receiving the first light, and emitting an electron;
an anode plate facing the cathode plate and spaced apart from the cathode plate; and
a phosphor formed in a lower part of the anode plate and emitting a second light when the emitted electron collides with the phosphor.

8. The photocathode lighting device of claim 7, further comprising:
a power source unit applying a predetermined voltage to the cathode plate and the anode plate; and
a logic circuit unit controlling the power source unit by considering the voltage outputted from the power source unit and a light source current of the light source unit.

9. The photocathode lighting device of claim 7, wherein the photocathode has a reflective mode.

10. The photocathode lighting device of claim 8, wherein the logic circuit unit receives a modulated light source current and a modulated voltage, outputs a control signal, and controls the power source unit.

11. The photocathode lighting device of claim 7, wherein the light source unit is a light emitting diode (LED).

12. The photocathode lighting device of claim 11, wherein a wavelength of the first light emitted from the LED has a range between about 450 and about 500 nm.

13. The photocathode lighting device of claim 7, wherein a ratio of a bottom diameter of an aperture of the plurality of apertures formed in a lower part of a metal mask, $d_2$, to an upper diameter of the aperture of the plurality of apertures in the metal mask, $d_1$, is greater than or equal to 2:1.

14. The photocathode lighting device of claim 13, wherein the ratio of the bottom diameter of the aperture, $d_2$, to the upper diameter of the aperture, $d_1$, is greater than or equal to 5:1.

15. The photocathode lighting device of claim 7, further comprising:
a mirror layer formed on a surface of the metal mask layer for external light reflection.

16. The photocathode lighting device of claim 15, wherein the mirror layer is made of a material selected from the group consisting of titanium dioxide ($TiO_2$) and Al.

17. A method of manufacturing a photocathode lighting device, the method comprising:
forming a light source unit emitting a first light and a cathode plate contacted face-to-face with the light source unit;

forming a metal mask layer adhered to the cathode plate and including a repetitive plurality of apertures;

forming a photocathode on a surface of the metal mask layer, receiving the first light, and emitting an electron;

forming an anode plate facing the cathode plate and spaced apart from the cathode plate; and forming a phosphor in a lower part of the anode plate, the phosphor emitting a second light when the emitted electron collides with the phosphor.

18. The method of claim 17, wherein the photocathode comprises a composite material including at least one element selected from the group consisting of an alkali metal, Sb, Te, Al, an I-VI group semiconductor, a II-VI group semiconductor, and a III-V group semiconductor.

* * * * *